US010566402B2

(12) United States Patent
Cho et al.

(10) Patent No.: US 10,566,402 B2
(45) Date of Patent: Feb. 18, 2020

(54) ORGANIC LIGHT-EMITTING DIODE DISPLAY AND METHOD OF MANUFACTURING THE SAME

(71) Applicant: Samsung Display Co., Ltd., Yongin-si, Gyeonggi-do (KR)

(72) Inventors: Seunghwan Cho, Yongin-si (KR); Sangho Park, Yongin-si (KR); Donghwan Shim, Yongin-si (KR); Kiwan Ahn, Yongin-si (KR); Joosun Yoon, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/080,388

(22) Filed: Mar. 24, 2016

(65) Prior Publication Data

US 2017/0053975 A1 Feb. 23, 2017

(30) Foreign Application Priority Data

Aug. 19, 2015 (KR) .................. 10-2015-0116849

(51) Int. Cl.
*H01L 27/32* (2006.01)
*H01L 51/56* (2006.01)

(52) U.S. Cl.
CPC ............................ *H01L 27/3265* (2013.01)

(58) Field of Classification Search
None
See application file for complete search history.

(56) References Cited

U.S. PATENT DOCUMENTS

| 9,673,267 | B2* | 6/2017 | Kim .................. H01L 27/3262 |
| 2001/0022365 | A1* | 9/2001 | Murade ............ H01L 29/78609 257/59 |
| 2007/0052352 | A1 | 3/2007 | Im et al. |
| 2007/0096636 | A1 | 5/2007 | Park et al. |
| 2008/0246026 | A1* | 10/2008 | Kim .................... H01L 27/3265 257/40 |
| 2009/0176326 | A1 | 7/2009 | Tseng |
| 2009/0278131 | A1 | 11/2009 | Kwon et al. |
| 2014/0034923 | A1 | 2/2014 | Kim et al. |

(Continued)

FOREIGN PATENT DOCUMENTS

| KR | 10-2003-0035219 A | 5/2003 |
| KR | 10-0659765 B1 | 12/2006 |

(Continued)

*Primary Examiner* — Walter H Swanson
*Assistant Examiner* — Kien C Ly
(74) *Attorney, Agent, or Firm* — F. Chau & Associates, LLC

(57) ABSTRACT

An organic light-emitting diode (OLED) display is disclosed. In one aspect, the display includes a plurality of pixels, each pixel including a driving circuit that includes a driving transistor and a storage capacitor electrically connected to the driving transistor. The driving transistor includes a driving active layer and a first electrode, the first electrode insulated from the driving active layer and disposed over at least a portion of the driving active layer. The storage capacitor includes a first capacitor including the first electrode and a second electrode facing the first electrode and a second capacitor comprising the second electrode and a third electrode facing the second electrode.

15 Claims, 13 Drawing Sheets

(56) References Cited

U.S. PATENT DOCUMENTS

| | | | |
|---|---|---|---|
| 2014/0118232 A1* | 5/2014 | Kim | H01L 27/124 |
| | | | 345/82 |
| 2015/0097172 A1* | 4/2015 | Han | H01L 27/3265 |
| | | | 257/40 |
| 2015/0243722 A1* | 8/2015 | Kwon | H01L 27/3262 |
| | | | 257/40 |

FOREIGN PATENT DOCUMENTS

| KR | 10-2007-0045690 A | 5/2007 |
|---|---|---|
| KR | 10-2009-0116131 A | 11/2009 |
| KR | 10-2014-0018623 A | 2/2014 |

* cited by examiner

ORGANIC LIGHT-EMITTING DIODE DISPLAY AND METHOD OF MANUFACTURING THE SAME

CROSS-REFERENCE TO RELATED APPLICATION

This application claims the benefit of Korean Patent Application No. 10-2015-0116849, filed on Aug. 19, 2015, in the Korean Intellectual Property Office, the disclosure of which is incorporated herein in its entirety by reference.

BACKGROUND

Field

The described technology generally relates to an organic light-emitting diode (OLED) display and a method of manufacturing the same.

Description of the Related Technology

A display device such as an OLED display or a liquid crystal display (LCD) includes various thin-film transistors (TFTs) capacitors, and multiple wiring lines. A substrate on which the display apparatus is manufactured includes fine patterns of the TFTs, the capacitors, and the wiring lines. Complex connections among the TFT, the capacitors, and the wiring lines allow the flow of electrical signals that result in images being displayed.

An OLED, used in each pixel circuit, includes a hole injection electrode, an electron injection electrode, and an interposed organic emission layer, and generates light when excitons when holes injected from the hole injection electrode and electrons injected from the electron injection electrode are combined and drop from an excited state to a ground state.

Since an OLED display is self-emissive and does not need source separate backlight, OLED technology has favorable characteristics such as low power consumption, lightweight, and thin profile, a wide viewing angle, a high contrast ratio, and a rapid response rate. Thus, OLED displays are widely used in personal mobile devices such as MP3 players or mobile phones and televisions (TVs).

As market demand for compact and high-resolution displays have recently increased, research has been directed to an efficient arrangement of a TFT, a capacitor, and wiring lines included in a display apparatus, a connection structure, and a method of forming the TFT, the capacitor, and wiring lines.

SUMMARY OF CERTAIN INVENTIVE ASPECTS

One inventive aspect relates to an OLED display having high resolution and improved image quality and a method of manufacturing the OLED display.

Another aspect is an OLED display that includes a plurality of pixels, each of the plurality of pixels including a driving circuit unit that includes a driving transistor and a storage capacitor electrically connected to the driving transistor, wherein the driving transistor includes a driving active layer and a first electrode that is insulated from the driving active layer and is disposed on at least a part of the driving active layer, and the storage capacitor includes: a first capacitor including the first electrode and a second electrode that faces the first electrode; and a second capacitor including the second electrode and a third electrode that faces the second electrode.

The first electrode of the first capacitor and the third electrode of the second capacitor may be electrically connected to each other.

The OLED display may further include a third insulating layer disposed between the second electrode and the third electrode, wherein the second electrode, the third insulating layer, and the third electrode include end portions that are continuously connected to one another without a step.

An area of the second electrode and an area of the third electrode may be greater than an area of the first electrode.

The OLED display may further include an organic light-emitting device, wherein the organic light-emitting device includes: a pixel electrode electrically connected to the driving transistor; a counter electrode facing the pixel electrode; and an intermediate layer disposed between the pixel electrode and the counter electrode and including an organic emission layer.

Each of the plurality of pixels may include: a scan line extending in a first direction and disposed on the same layer as the first electrode; a data line extending in a second direction that crosses the first direction and disposed on a layer over a layer on which the third electrode is disposed; and a power line configured to apply a voltage to the driving transistor and disposed on the same layer as the data line.

The OLED display may further include: a first insulating layer disposed between the driving active layer and the first electrode; a second insulating layer disposed between the first electrode and the second electrode; a third insulating layer disposed between the second electrode and the third electrode; and a fourth insulating layer disposed between the third electrode and the data line and between the third electrode and the power line, wherein the second electrode is connected to the power line through a first contact hole formed in the third insulating layer and the fourth insulating layer.

The third electrode may include a first opening formed to correspond to the first contact hole, and an area of the first opening is greater than an area of the first contact hole.

The driving active layer of the driving transistor may include a driving source region formed to receive a voltage from the power line, a driving drain region spaced apart from the driving source region, and a driving channel region formed to connect the driving source region and the driving drain region, wherein the OLED display further includes a compensation transistor configured to electrically connect the driving drain region and the storage capacitor.

The compensation transistor may include a compensation drain electrode electrically connected to the first electrode and disposed on the same layer as the data line, wherein the compensation drain electrode is connected to the third electrode through a second contact hole formed in the fourth insulating layer.

The compensation drain electrode may be connected to the first electrode through a third contact hole formed in the second insulating layer and the fourth insulating layer.

Another aspect is a method of manufacturing an OLED display including a plurality of pixels, each of the plurality of pixels including a driving transistor for driving each of the plurality of pixels and a storage capacitor electrically connected to the driving transistor includes: forming a driving active layer included in the driving transistor on a substrate; forming a first insulating layer on the driving active layer; forming on the first insulating layer a first electrode configured to function as a gate electrode of the driving transistor and an electrode of the storage capacitor; forming a second insulating layer on the first insulating layer to cover the first electrode; forming a second electrode of the storage capacitor on the second insulating layer to face the first electrode; forming a third insulating layer on the second electrode; and forming a third electrode of the storage capacitor on the third insulating layer to face the second electrode.

The forming of the second electrode, the third insulating layer, and the third electrode may include: forming a first conductive material; forming a second insulating material on the first conductive material; forming a second conductive material on the second insulating material; and patterning the first conductive material, the second insulating material, and the second conductive material by using one mask.

The method may further include forming a first opening in the third electrode to expose the third insulating layer.

The one mask may be a half-tone mask including a light-shielding portion for shielding light, a transparent portion for transmitting light, and a semi-transparent portion for transmitting part of light, wherein the transparent portion corresponds to a portion where the first conductive material, the second insulating material, and the second conductive material are removed, and the semi-transparent portion corresponds to a portion for forming the first opening in the third electrode.

The method may further include: forming a fourth insulating layer on the third insulating layer to cover the third electrode; and forming a power line on the fourth insulating layer.

After the forming of the fourth insulating layer, the method may further include forming a first contact hole in the fourth insulating layer and the third insulating layer that is exposed through the first opening formed in the third electrode, wherein the second electrode is connected to the power line through the first contact hole.

The patterning of the first conductive material, the second insulating material, and the second conductive material may further include forming a second opening by patterning the first conductive material, the second insulating material, and the second conductive material.

After the forming of the fourth insulating layer, the method may further include: forming a second contact hole in the fourth insulating layer and a third contact hole in the fourth insulating layer and the second insulating layer that is exposed through the second opening; and forming a compensation drain electrode on the fourth insulating layer, wherein the compensation drain electrode is connected to the first electrode and the third electrode respectively through the second contact hole and the third contact hole.

The method may further include: forming a pixel electrode electrically connected to the driving transistor; forming an intermediate layer including an organic emission layer on the pixel electrode; and forming a counter electrode on the intermediate layer.

Another aspect is an organic light-emitting diode (OLED) display, comprising: a plurality of pixels, each pixel comprising a driving circuit, wherein the driving circuit includes a driving transistor and a storage capacitor electrically connected to the driving transistor, wherein the driving transistor comprises a driving active layer and a first electrode, wherein the first electrode is insulated from the driving active layer and disposed over at least a portion of the driving active layer, and wherein the storage capacitor comprises a first capacitor comprising the first electrode and a second electrode facing the first electrode and a second capacitor comprising the second electrode and a third electrode facing the second electrode.

In the above OLED display, the first and third electrodes are electrically connected to each other.

The above OLED display further comprises an insulating layer interposed between the second and third electrodes, wherein the second electrode, the insulating layer, and the third electrode comprise end portions that are continuously connected to one another without a step.

In the above OLED display, each of the second and third electrodes has an area larger than that of the first electrode.

The above OLED display further comprises an OLED including: a pixel electrode electrically connected to the driving transistor; a counter electrode facing the pixel electrode; and an organic emission layer interposed between the pixel and counter electrodes.

In the above OLED display, each of the pixels comprises: a scan line extending in a first direction and disposed on the same layer as the first electrode; a data line extending in a second direction that crosses the first direction and disposed over a layer on which the third electrode is disposed; and a power line configured to apply a voltage to the driving transistor and disposed on the same layer as the data line.

The above OLED display further comprises: a first insulating layer interposed between the driving active layer and the first electrode; a second insulating layer interposed between the first and second electrodes; a third insulating layer interposed between the second and third electrodes; and a fourth insulating layer interposed between the third electrode and the data line and between the third electrode and the power line, wherein the third and fourth insulating layers have a first contact hole formed therethrough, and wherein the second electrode is electrically connected to the power line through the first contact hole.

In the above OLED display, the third electrode has a first opening corresponding to the first contact hole, wherein the first opening has an area larger than that of the first contact hole.

In the above OLED display, the driving active layer comprises a driving source region configured to receive a voltage from the power line, a driving drain region spaced apart from the driving source region, and a driving channel region configured to electrically connect the driving source and drain regions to each other, wherein the OLED display further comprises a compensation transistor configured to electrically connect the driving drain region and the storage capacitor to each other.

In the above OLED display, the compensation transistor comprises a compensation drain electrode electrically connected to the first electrode and disposed on the same layer as the data line, wherein the fourth insulating layer has a second contact hole formed therethrough, and wherein the compensation drain electrode is connected to the third electrode through the second contact hole.

In the above OLED display, the second and fourth insulating layers have a third contact hole formed therethrough, wherein the compensation drain electrode is electrically connected to the first electrode through the third contact hole.

In the above OLED display, the first capacitor at least partially overlaps the second capacitor in the depth dimension of the OLED display.

In the above OLED display, each of the second and third electrodes is thicker than the first electrode.

Another aspect is a method of manufacturing an OLED display comprising a plurality of pixels each including a driving transistor configured to drive the respective pixel and a storage capacitor electrically connected to the driving transistor, the method comprising: forming a driving active layer included in the driving transistor over a substrate; forming a first insulating layer over the driving active layer;

forming a first electrode over the first insulating layer, wherein the first electrode is configured to function as a gate electrode of the driving transistor and an electrode of the storage capacitor, forming a second insulating layer over the first insulating layer to cover the first electrode; forming a second electrode of the storage capacitor over the second insulating layer to face the first electrode; forming a third insulating layer over the second electrode; and forming a third electrode of the storage capacitor over the third insulating layer to face the second electrode.

In the above method, the forming of the second electrode, the third insulating layer, and the third electrode comprises: forming a first conductive material; forming an insulating material over the first conductive material; forming a second conductive material over the insulating material; and patterning the first conductive material, the insulating material, and the second conductive material via a mask.

The above method further comprises forming a first opening in the third electrode.

In the above method, the mask is a half-tone mask comprising a light-shielding portion configured to shield light, a transparent portion configured to transmit light, and a semi-transparent portion configured to transmit a portion of light, wherein the transparent portion corresponds to where the first conductive material, the insulating material, and the second conductive material are removed, and wherein the semi-transparent portion corresponds to the first opening in the third electrode.

The above method further comprises: forming a fourth insulating layer over the third insulating layer to cover the third electrode; and forming a power line over the fourth insulating layer.

The above method further comprises forming a first contact hole in the fourth and third insulating layers after the forming of the fourth insulating layer, wherein the second electrode is connected to the power line through the first contact hole.

In the above method, the patterning comprises patterning the first conductive material, the insulating material, and the second conductive material so as to form a second opening in the second electrode, the third insulating layer and the third electrode.

The above method, after the forming of the fourth insulating layer, further comprises: forming a second contact hole in the fourth insulating layer and a third contact hole in the fourth and second insulating layers; and forming a compensation drain electrode over the fourth insulating layer, wherein the compensation drain electrode is connected to both the first and third electrode respectively through the second and third contact holes.

The above method further comprises: forming a pixel electrode electrically connected to the driving transistor; forming an organic emission layer over the pixel electrode; and forming a counter electrode over the organic emission layer.

DETAILED DESCRIPTION OF CERTAIN INVENTIVE EMBODIMENTS

Figure 1:
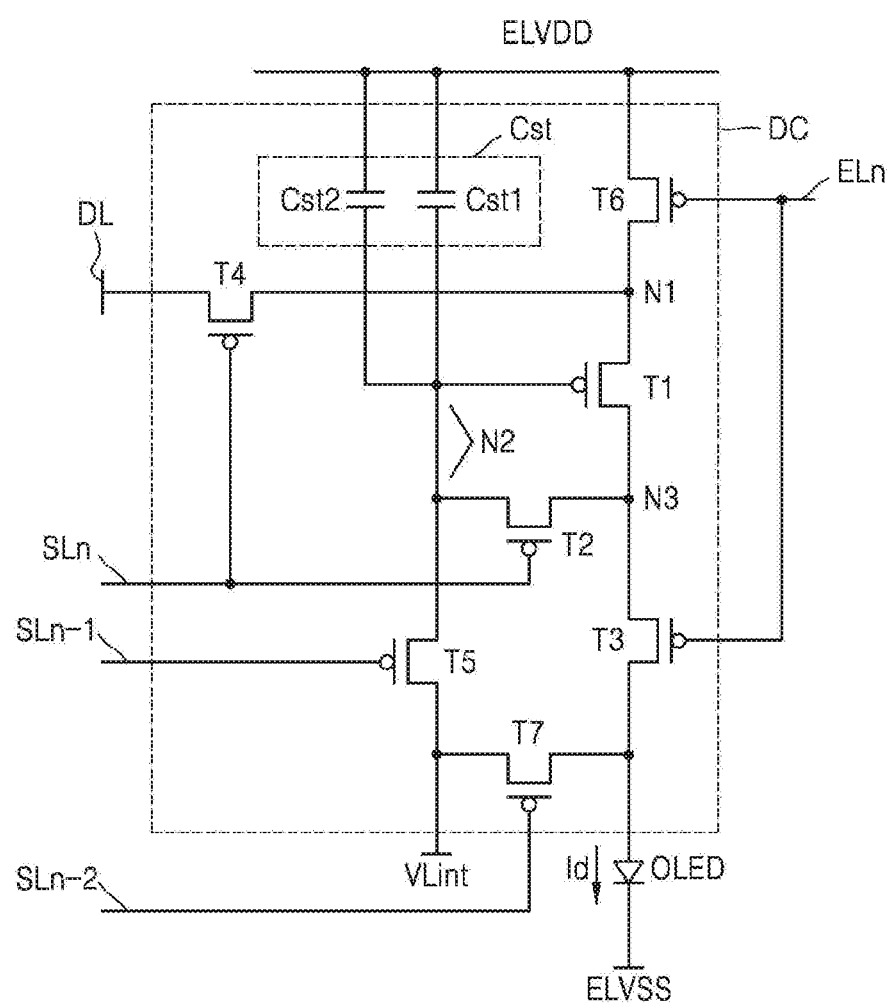
FIG. 1 is an equivalent circuit diagram of one pixel included in an OLED display according to an exemplary embodiment.

The described technology may include various exemplary embodiments and modifications, and exemplary embodiments thereof will be illustrated in the drawings and will be described herein in detail. The advantages and features of the described technology and methods of achieving the advantages and features will be described more fully with reference to the accompanying drawings, in which exemplary embodiments are shown. The present exemplary embodiments may have different forms and should not be construed as being limited to the descriptions set forth herein.

It will be understood that although the terms "first", "second", etc. may be used herein to describe various elements, these elements should not be limited by these terms. These elements are only used to distinguish one element from another.

As used herein, the singular forms "a", "an", and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

In the drawings, sizes of elements may be exaggerated for convenience of explanation. For example, since sizes and thicknesses of elements in the drawings are arbitrarily illustrated for convenience of explanation, the following exemplary embodiments are not limited thereto.

When a certain embodiment may be implemented differently, a specific process order may be performed differently from the described order. For example, two consecutively described processes may be performed substantially at the same time or performed in an order opposite to the described order.

Reference will now be made in detail to embodiments, examples of which are illustrated in the accompanying drawings. In the drawings, the same elements are denoted by the same reference numerals, and a repeated explanation thereof will not be given.

As used herein, the term "and/or" includes any and all combinations of one or more of the associated listed items. Expressions such as "at least one of" when preceding a list of elements, modify the entire list of elements and do not modify the individual elements of the list. In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

Also, in the accompanying drawings, although an active matrix display apparatus has a 7Tr-1Cap structure in which a driving circuit unit for driving one pixel includes seven transistors and one storage capacitor including two, that is, first and second, capacitors that are connected in parallel to each other, the described technology is not limited thereto. Accordingly, a driving circuit unit included in one pixel may include six or less transistors or eight or more transistors, and two or more capacitors. The term "pixel" refers to a smallest unit for displaying an image and an OLED display displays an image through a plurality of pixels.

An OLED display according to an exemplary embodiment will now be explained with reference to FIGS. 1 and 3.

FIG. 1 is an equivalent circuit diagram of one pixel included in an OLED display according to an exemplary embodiment.

Referring to FIG. 1, the OLED display according to an exemplary embodiment includes a display area in which an image is displayed and a peripheral area formed around the display area. A plurality of pixels for emitting light, and a driving circuit unit (or driving circuit) DC for driving the pixels, and a plurality of wiring lines for applying electrical signals to the driving circuit unit DC are disposed in the display area.

The wiring lines may include first through third scan lines SLn, SLn−1, and SLn−2 that transmit a scan signal and extend in a first direction, a data line DL that transmits a data signal and extends in a second direction that crosses the first direction, and a power line ELVDD that transmits a driving voltage. According to an exemplary embodiment, the wiring lines may further include an initialization voltage line VLint that transmits an initialization voltage and an emission control line ELn that transmits an emission control signal as shown in FIG. 1.

The driving circuit unit DC may include seven transistors and one storage capacitor Cst, and the storage capacitor Cst may include a first capacitor Cst1 and a second capacitor Cst2 that are connected in parallel to each other.

The seven transistors may include a driving transistor T1, a switching transistor T4, a compensation transistor T2, a first initialization transistor T5, a first emission control transistor T6, a second emission control transistor T3, and a second initialization transistor T7.

The switching transistor T4 includes a gate electrode connected to the first scan line SLn, a source electrode connected to the data line DL, and a drain electrode connected to a first node N1. The switching transistor T4 is turned on by a scan signal having a gate-on voltage transmitted through the first scan line SLn, and transmits a data signal transmitted through the data line DL to the first node N1.

The driving transistor T1 includes a gate electrode connected to a second node N2, a source electrode connected to the first node N1, and a drain electrode connected to a third node N3. The driving transistor T1 supplies current corresponding to a difference between voltages applied to the first node N1 and the second node N2 to the third node N3.

The compensation transistor T2 includes a gate electrode connected to the first scan line SLn, a source electrode connected to the second node N2, and a drain electrode connected to the third node N3. The compensation transistor T2 is turned on by a scan signal of a gate-on voltage transmitted through the first scan line SLn, and connects the source electrode and the gate electrode of the driving transistor T1. That is, the compensation transistor T2 compensates for a threshold voltage of the driving transistor T1 by diode-connecting the driving transistor T1.

The first initialization transistor T5 includes a gate electrode connected to the second scan line SLn−1, a source electrode connected to the second node N2, and a drain electrode connected to the initialization voltage line VLint. The first initialization transistor T5 is turned on by a previous scan signal of a gate-on voltage transmitted through the second scan line SLn−1, and applies an initialization voltage transmitted through the initialization voltage line VLint to the second node N2, that is, the gate electrode of the driving transistor T1. That is, the first initialization transistor T5 initializes a voltage of the gate electrode of the driving transistor T1.

The first emission control transistor T6 includes a gate electrode connected to the emission control line ELn, a drain electrode to which a driving voltage transmitted through the power line ELVDD is applied, and a source electrode connected to the first node N1. When the first emission control transistor T6 is turned on, a driving voltage is applied to the first node N1, that is, the source electrode of the driving transistor T1.

The second emission control transistor T3 includes a gate electrode connected to the emission control line ELn, a drain electrode connected to the third node N3, and a source electrode connected to a pixel electrode 20 (see FIG. 3) of an organic light-emitting diode OLED. The first emission control transistor T6 and the second emission control transistor T3 are simultaneously turned on by an emission control signal transmitted through the emission control line ELn, and allow a driving current to flow through the OLED.

The second initialization transistor T7 includes a gate electrode connected to the third scan line SLn−2, a source electrode connected to the initialization voltage line VLint, and a drain electrode connected to the pixel electrode 20 (see FIG. 3) of the OLED. The second initialization transistor T7 is turned on by a scan signal transmitted through the third scan line SLn−2, and initializes the pixel electrode 20 (see FIG. 3) of the OLED. The gate electrode of the second initialization transistor T7 may be connected to a scan line other than the third scan line SLn−2 or an additional wiring line, and may be omitted if necessary.

The storage capacitor Cst including the first capacitor Cst1 and the second capacitor Cst2 that are connected in parallel to each other may be disposed between the second node N2 and the power line ELVDD.

The OLED includes the pixel electrode 20 (see FIG. 3) and a counter electrode 22 (see FIG. 3) to which a common voltage transmitted through a common power line ELVSS is applied. According to an exemplary embodiment, the organic light-emitting display device OLED may emit red light, green light, blue light, or white light.

Although the transistors T1 through T7 may be p-channel field effect transistors according to an exemplary embodiment, the described technology is not limited thereto and at least some of the transistors T1 through T7 may be n-channel field effect transistors.

Figure 2:
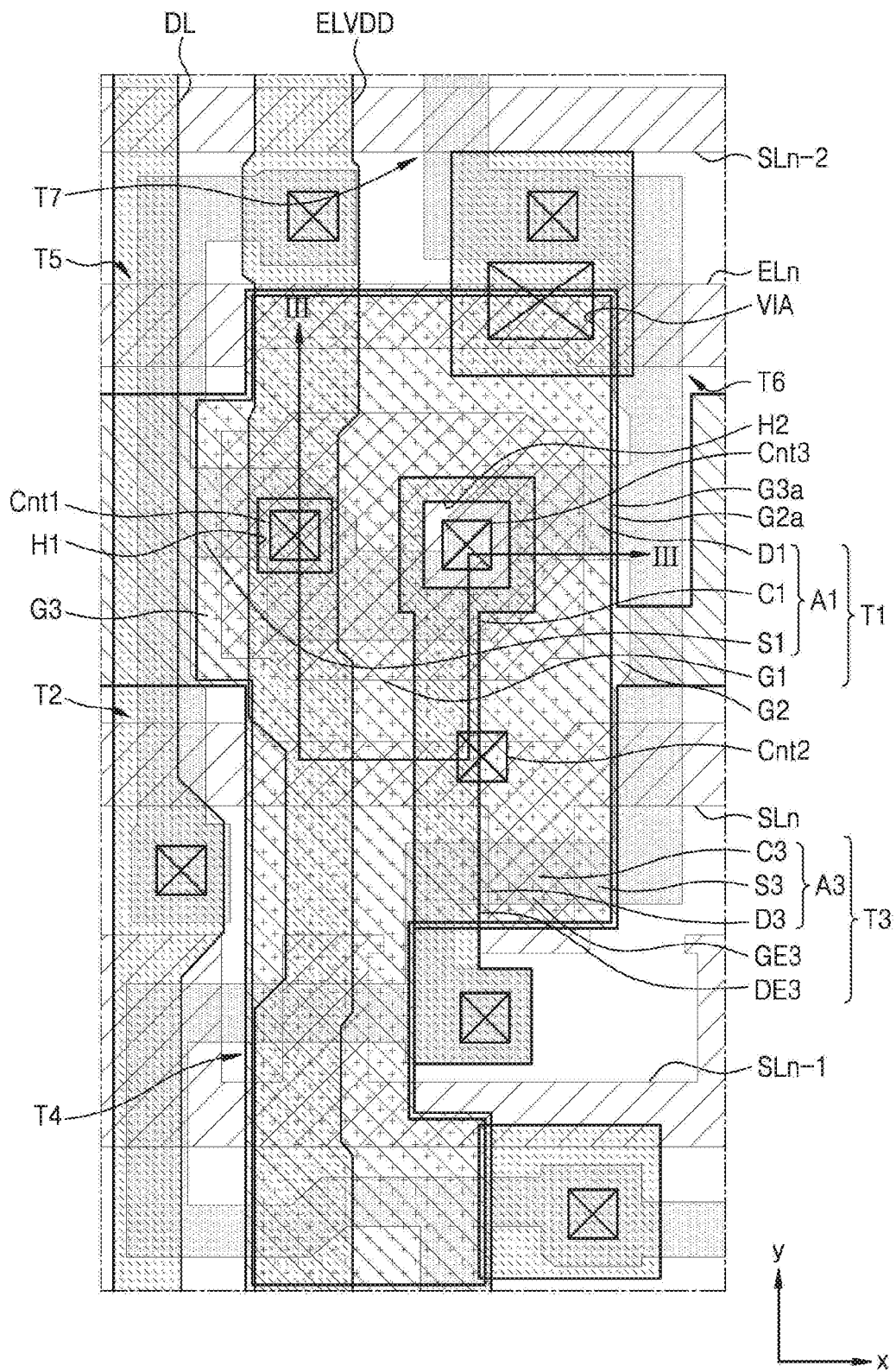
FIG. 2 is a plan view of one pixel included in the OLED display according to an exemplary embodiment.

FIG. 2 is a plan view of one pixel included in the OLED display according to an exemplary embodiment. FIG. 3 is a cross-sectional view taken along line III-III of FIG. 2.

Figure 3:
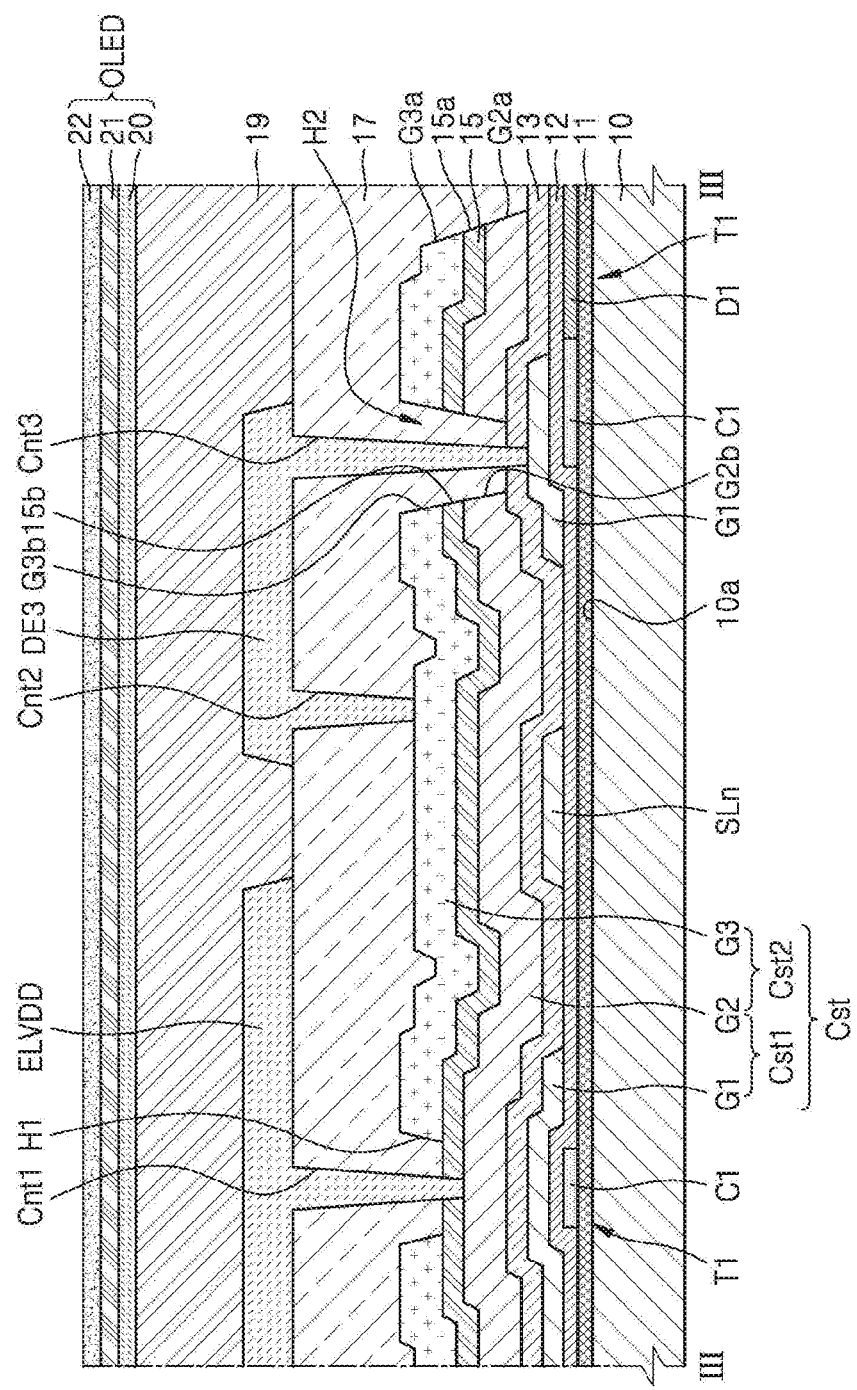
FIG. 3 is a cross-sectional view taken along line III-III of FIG. 2.

Referring to FIGS. 2 and 3, the OLED display according to an exemplary embodiment includes a plurality of pixels, and each of the pixels includes the driving circuit unit DC (see FIG. 1) including the driving transistor T1 and the storage capacitor Cst that is electrically connected to the driving transistor T1. The driving transistor T1 includes a driving active layer A1 and a first electrode G1 that is insulated from the driving active layer A1 and is disposed on at least a part of the driving active layer A1, and the storage capacitor Cst includes the first capacitor Cst1 that includes the first electrode G1 and a second electrode G2 facing the first electrode G1 and the second capacitor Cst2 that includes the second electrode G2 and a third electrode G3 facing the second electrode G2.

A buffer layer 11 that prevents penetration of impurity elements and planarizes a surface of a substrate 10 may be disposed on the substrate 10. The driving circuit unit DC (see FIG. 1) including the seven transistors T1 through T7 and one storage capacitor Cst including the first and second capacitors Cst1 and Cst2 may be disposed on the buffer layer 11. A barrier layer (not shown) may be further disposed between the substrate 10 and the buffer layer 11, and the buffer layer 11 may be omitted.

The substrate 10 may be formed of any of various materials such as glass, metal, or plastic. According to an exemplary embodiment, the substrate 10 may be a flexible substrate. The term "flexible substrate" can refer to a substrate that is easily bent, folded, or rolled. When the substrate 10 is a flexible substrate, the substrate 10 may be formed of an ultra-thin glass, metal, or plastic. For example, when the substrate 10 includes plastic, the substrate 10 may include, but is not limited to, polyimide (PI).

Elements included in a device such as the driving transistor T1 and the storage capacitor Cst will now be explained in an order in which the elements are stacked.

An active layer including a semiconductor material may be disposed on the buffer layer 11. The active layer may include the driving active layer A1 of the driving transistor T1. The active layer may include all of active layers of the switching transistor T4, the compensation transistor T2, the first initialization transistor T5, the first emission control transistor T6, the second emission control transistor T3, and the second initialization transistor T7 as well as the driving active layer A1.

For example, the active layer including the driving active layer A1 may include amorphous silicon or polycrystalline silicon. However, the described technology is not limited thereto, and the active layer according to another exemplary embodiment may be formed of an organic semiconductor material or an oxide semiconductor material.

The driving active layer A1 may include a driving source region S1 and a driving drain region D1 that are spaced apart from each other. A driving channel region C1 may be disposed between the driving source region S1 and the driving drain region D1. The driving source region S1 and the driving drain region D1 may be conductive regions formed by doping a semiconductor material with impurities.

A first insulating layer 12 may be disposed on the buffer layer 11 to cover the active layer including the driving active layer A1. A first conductive layer may be disposed on the first insulating layer 12. The first conductive layer may include the first electrode G1 that is disposed on at least a part of the driving active layer A1.

The first electrode G1 may be a driving gate electrode of the driving transistor T1, and may have a single-layer structure or a multi-layer structure formed of at least one selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

The first conductive layer may include all of gate electrodes of the switching transistor T4, the compensation transistor T2, the first initialization transistor T5, the first emission control transistor T6, the second emission control transistor T3, and the second initialization transistor T7 as well as the first electrode G1. Also, the first conductive layer may include the first scan line SLn, the second scan line SLn−1, the third scan line SLn−2, and the emission control line ELn that extend in a first direction x. That is, the first electrode G1 may be disposed on the same layer as the first scan line SLn.

A second insulating layer 13 may be disposed on the first insulating layer 12 to cover the first conductive layer including the first electrode G1 and the first scan line SLn. According to an exemplary embodiment, each of the first insulating layer 12 and the second insulating layer 13 may have a single-layer structure or a multi-layer structure formed of silicon oxide ($SiO_2$) and/or silicon nitride ($SiN_x$).

A second conductive layer may be disposed on the second insulating layer 13. The second conductive layer may include the second electrode G2 facing the first electrode G1. The first electrode G1 and the second electrode G2 may be included in the first capacitor Cst1, and may overlap the driving transistor T1 and the first capacitor Cst1 in a plan view. For example, the driving transistor T1 and the first capacitor Cst1 may overlap each other in a direction substantially perpendicular to (or crossing) a main surface 10a of the substrate 10.

The second electrode G2 may have a single-layer structure or a multi-layer structure including at least one of Al, Pt, Pd, Ag, Mg, Au, Ni, Nd, Ir, Cr, Li, Ca, Mo, Ti, W, and Cu, and an area of the second electrode G2 may be greater than an area of the first electrode G1 which will be explained below.

A third insulating layer 15 may be disposed on the second insulating layer 13 to cover the second electrode G2, and a third conductive layer may be disposed on the third insulating layer 15. The third conductive layer may include the third electrode G3 facing the second electrode G2. The second electrode G2 and the third electrode G3 may be included in the second capacitor Cst2, and the driving transistor T1 and the second capacitor Cst2 may overlap each other in a plan view.

The third electrode G3 may have a single-layer structure or a multi-layer structure formed of at least one of Al, Pt, Pd, Ag, Mg, Au, Ni, Nd, Ir, Cr, Li, Ca, Mo, Ti, W, and Cu, and an area of the third electrode G3 may be greater than an area of the first electrode G1. That is, the second electrode G2 and the third electrode G3 may completely cover all portions of the entire first electrode G1 other than a portion corresponding to a third contact hole Cnt3 in a plan view.

The second electrode G2 and the third electrode G3 may be disposed on layers different from layers on which the scan lines SLn, SLn−1, and SLn−2, the data line DL, and the power line ELVDD are disposed, and thus may be formed to have large areas in a pixel. The second electrode G2 and the third electrode G3 may face each other and may be insulated from each other by the third insulating layer 15. That is, the second electrode G2 and the third electrode G3 may be included in the second capacitor Cst2. Since the second electrode G2 and the third electrode G3 may be formed to have large areas, the second capacitor Cst2 may have a high capacity.

According to an exemplary embodiment, the second insulating layer 13 and the third insulating layer 15 may be formed of silicon nitride ($SiN_x$). The silicon nitride ($SiN_x$) may have a relatively high refractive index among inorganic insulating materials, and thus a capacity of the first capacitor Cst1 including the first electrode G1 and the second electrode G2 with the second insulating layer 13 therebetween and a capacity of the second capacitor Cst2 including the second electrode G2 and the third electrode G3 with the third insulating layer 15 therebetween may be increased.

The second capacitor Cst2 may be electrically connected in parallel to the first capacitor Cst1 as shown in FIG. 1. Accordingly, since a capacity of the storage capacitor Cst including the first capacitor Cst1 and the second capacitor Cst2 that are connected in parallel to each other is the sum of a capacity of the first capacitor Cst1 and a capacity of the second capacitor Cst2, a capacity of the storage capacitor Cst included in the OLED display may be further increased.

According to an exemplary embodiment, the second electrode G2 and the third electrode G3 may include end portions G2a and G3a formed on outer edges. The end portion G2a of the second electrode G2, the end portion G3a of the third electrode G3, and an end portion 15a of the third insulating layer 15 may be continuously connected to one another without a step. The second electrode G2, the third insulating layer 15, and the third electrode G3 may be patterned by using an etching process using one mask, and thus the second electrode G2, the third insulating layer 15, and the third electrode G3 may have the same etched surface which will be explained below.

The third electrode G3 may include a first opening H1 through which a part of the third insulating layer 15 is exposed, and the first opening H1 may be a path for forming a first contact hole Cnt1 that connects the power line ELVDD and the second electrode G2. The third insulating layer 15 and the second electrode G2 may be disposed under the first opening H1.

The second electrode G2, the third insulating layer 15, and the third electrode G3 may respectively include openings G2b, 15b, and G3b formed at the same position, and the openings G2b, 15b, and G3b may be connected to one another to form a second opening H2 through which a part of the second insulating layer 13 is exposed.

The second opening H2 may be a path for forming the third contact hole Cnt3 that electrically connects a compensation drain electrode DE3 and the first electrode G1. The compensation drain electrode DE3 may function as a bridge for electrically connecting the first electrode G1 and the third electrode G3. The first capacitor Cst1 and the second capacitor Cst2 may be connected in parallel to each other by electrically connecting the first electrode G1 and the third electrode G3.

A fourth insulating layer 17 may be disposed on the third insulating layer 15 to cover the third electrode G3, and a fourth conductive layer may be disposed on the fourth insulating layer 17. The fourth conductive layer may include the data line DL, the power line ELVDD, and the compensation drain electrode DE3 of the compensation transistor T2.

According to an exemplary embodiment, the fourth insulating layer 17 may have a single-layer structure or a multi-layer structure including silicon oxide ($SiO_x$) and/or silicon nitride ($SiN_x$). The fourth conductive layer may have a single-layer structure or a multi-layer structure including at least one of Al, Pt, Pd, Ag, Mg, Au, Ni, Nd, Ir, Cr, Li, Ca, Mo, Ti, W, and Cu.

The data line DL may extend in a second direction y that crosses the first direction x, and thus may cross the first scan line SLn that extends in the first direction x. The power line ELVDD may apply a voltage to the driving transistor T1 and may be disposed on the same layer as the data line DL. That is, the data line DL and the power line ELVDD may be disposed on a layer over a layer on which the third electrode G3 is disposed.

The power line ELVDD may be connected to the second electrode G2 through the first contact hole Cnt1 formed in the third insulating layer 15 and the fourth insulating layer 17. The first contact hole Cnt1 may be formed to correspond to the first opening H1 formed in the third electrode G3, and an area of the first opening H1 may be greater than an area of the first contact hole Cnt1.

Due to the first opening H1, a portion where the third electrode G3 is not disposed may exist between the third insulating layer 15 and the fourth insulating layer 17, and thus the first contact hole Cnt1 may be formed by simultaneously patterning the fourth insulating layer 17 and the third insulating layer 15. Since an area of the first opening H1 is greater than an area of the first contact hole Cnt1, the power line ELVDD buried in the first contact hole Cnt1 may not contact the third electrode G3. That is, the power line ELVDD may contact the second electrode G2 that is disposed under the third insulating layer 15 through the first contact hole Cnt1.

The OLED display according to an exemplary embodiment may include the compensation transistor T2 (see FIG. 1) that electrically connects the storage capacitor Cst and the driving drain region D1 of the driving transistor T1. The compensation transistor T2 (see FIG. 1) may include a compensation active layer A3 including a compensation source region S3, a compensation drain region D3 spaced apart from the compensation source region S1, and a compensation channel region C3 disposed between the compensation source region S3 and the compensation drain region D3, a compensation gate electrode GE3 insulated from the compensation active layer A3, and the compensation drain electrode DE3 electrically connected to the compensation drain region D3.

The compensation drain electrode DE3 may function as a bridge for connecting the first electrode G1 and the third electrode G3, and may be connected to the third electrode G3 through a second contact hole Cnt2 formed in the fourth insulating layer 17.

As described above, before the fourth insulating layer 17 is formed, since the openings G2b, 15b, and G3b are respectively formed in the second electrode G2, the third insulating layer 15, and the third electrode G3, the second opening H2 through which the second insulating layer 13 is exposed may be formed. The third contact hole Cnt3 may be formed in the fourth insulating layer 17 and the second insulating layer 13 that is exposed through the second opening H2.

An area of the second opening H2 may be greater than an area of the third contact hole Cnt3, and thus the compensation drain electrode DE3 may not contact the second electrode G2 and the third electrode G3 and may be connected to the first electrode G1.

A fifth insulating layer 19 may be disposed on the fourth insulating layer 17 to cover the fourth conductive layer. The OLED including the pixel electrode 20 that is electrically connected to the driving transistor T1, the counter electrode 22 that faces the pixel electrode 20, and an intermediate layer 21 that includes an organic emission layer and is disposed between the pixel electrode 20 and the counter electrode 22, may be disposed on the fifth insulating layer 19. The driving transistor T1 and the pixel electrode 20 may be directly connected to each other or may be connected to each other through another transistor. Referring to FIG. 1, the driving transistor T1 may be electrically connected to the pixel electrode 20 of the OLED through the second emission control transistor T3.

The fourth insulating layer 17 may planarize a stepped portion formed due to the transistors T1 through T7 (see FIG. 1) and the storage capacitor Cst included in the driving circuit unit DC (see FIG. 1), and may have a single-layer structure or a multi-layer structure including an organic insulating material. However, the described technology is not limited thereto, and the fifth insulating layer 19 according to another exemplary embodiment may have a structure in which an inorganic insulating film and an organic insulating film are stacked.

The fifth insulating layer 19 includes a via-hole VIA and the pixel electrode 20 is connected to the driving circuit unit DC (see FIG. 1) through the via-hole VIA. According to an exemplary embodiment, the pixel electrode 20 may be connected to a drain electrode of the second emission control transistor T3 through the via-hole VIA.

The OLED display according to an exemplary embodiment may be a top-emission display apparatus that displays an image toward the counter electrode 22 from the intermediate layer 21, and the pixel electrode 20 may be a reflective electrode. According to an exemplary embodiment, the pixel electrode 20 may include a metal reflective film such as Ag, Mg, Al, Pt, Pd, Au, Ni, Nd, Ir, or Cr, and may include a transparent conductive oxide disposed over and/or under the metal reflective film. The transparent conductive oxide may be at least one of indium tin oxide (ITO), indium zinc oxide (IZO), zinc oxide (ZnO), indium oxide ($In_2O_3$), indium gallium oxide (IGO), and aluminum zinc oxide (AZO).

The intermediate layer 21 including the organic emission layer may be disposed on the pixel electrode 20. The organic emission layer may be formed of a low-molecular weight organic material or a high-molecular weight organic material that emits light. The intermediate layer 21 may further include at least one of a hole injection layer, a hole transport layer, an electron transport layer, and an electron injection layer in addition to the organic emission layer. According to an exemplary embodiment, the intermediate layer 21 may further include various other functional layers in addition to the above layers.

The organic emission layer may be disposed in one OLED. In this case, the OLED may emit red light, green light, or blue light according to a type of the organic emission layer included in the OLED. However, the described technology is not limited thereto, and a plurality of organic emission layers may be disposed in one OLED. For example, a plurality of organic emission layers that emit red light, green light, and blue light may be vertically stacked or mixed to emit white light. In this case, a color conversion layer or a color filter for converting the emitted white light into predetermined color light may be further provided. The red light, the green light, and the blue light are exemplary, and a combination of color light for emitting white light is not limited thereto.

The counter electrode 22 may be disposed on the intermediate layer 21 and may include any of various conductive materials. For example, the counter electrode 22 is formed of at least one of Li, Ca, LiF, Al, Mg, and Ag and may be formed to have a single-layer structure or a multi-layer structure. The counter electrode 22 may be formed as a thin film, and thus may have a high transmittance. Accordingly, light emitted from the intermediate layer 21 may pass through the counter electrode 22 to be emitted to the outside, thereby displaying an image.

The OLED display according to another exemplary embodiment may be a bottom-emission display apparatus that displays an image toward the substrate 10 from the intermediate layer 21. In this case, the pixel electrode 20 may be a transparent or semi-transparent electrode and the counter electrode 22 may be a reflective electrode.

The OLED display according to the exemplary embodiment may include the storage capacitor Cst having a high capacity while occupying a minimum space. When a capacity of the storage capacitor Cst is low, a variation of current flowing through the OLED disposed in each of the pixels is increased, thereby causing an image formed by the OLED display to have a stain. Also, when a capacity of the storage capacitor Cst is low, the effect of a parasitic capacitor that may be formed between conductive layers disposed on different layers may be increased, thereby reducing the image quality of the OLED display.

According to an exemplary embodiment, since the first capacitor Cst1 and the second capacitor Cst2 are connected in parallel to each other, areas of the second electrode G2 and the third electrode G3 are maximized, and the second electrode G2 and the third electrode G3 overlap the driving transistor T1 in a plan view, the storage capacitor Cst may have a high capacity while occupying a minimum space and the image quality of the OLED display including the storage capacitor Cst may be improved.

FIGS. 4 through 13 are cross-sectional views for sequentially explaining a method of manufacturing the OLED display of FIG. 3.

Referring to FIGS. 4 through 13, the method of manufacturing the OLED display according to an exemplary embodiment includes forming the driving active layer A1 (see FIG. 2) included in the driving transistor T1 on the substrate 10, forming the first insulating layer 12 on the driving active layer A1 (see FIG. 2), forming the first electrode G1 that functions as a gate electrode of the driving transistor T1 and an electrode of the storage capacitor Cst on the first insulating layer 12, forming the second insulating layer 13 on the first insulating layer 12 to cover the first electrode G1, forming the second electrode G2 of the storage capacitor Cst on the second insulating layer 13 to face the first electrode G1, forming the third insulating layer 15 on the second electrode G2, and forming the third electrode G3 of the storage capacitor Cst on the third insulating layer 15 to face the second electrode G2.

Figure 4:
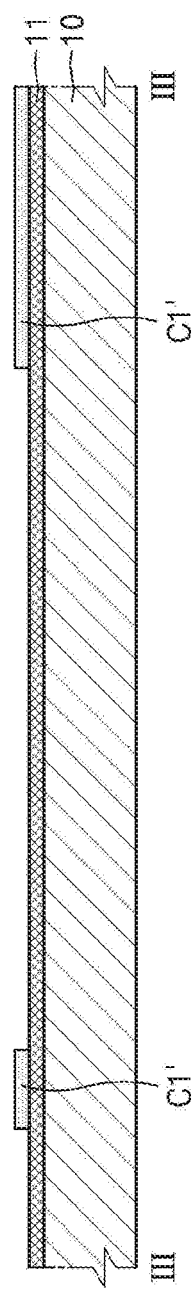
FIGS. 4, 5, 6, 7, 8, 9, 10, 11, 12 and 13 are cross-sectional views for sequentially explaining a method of forming the OLED display of FIG. 3.

Referring to FIG. 4, the buffer layer 11 and a semiconductor layer C1' may be formed on the substrate 10. The substrate 10 may be formed of any of various materials such as glass, metal, or plastic, and the buffer layer 11 may be formed of an inorganic insulating material such as silicon oxide ($SiO_2$) and/or silicon nitride ($SiN_x$). The buffer layer 11 may be omitted if necessary.

The semiconductor layer C1' may include amorphous silicon or polycrystalline silicon. However, the described technology is not limited thereto, and the semiconductor layer C1' according to another exemplary embodiment may include an organic semiconductor material or an oxide semiconductor material.

Figure 5:
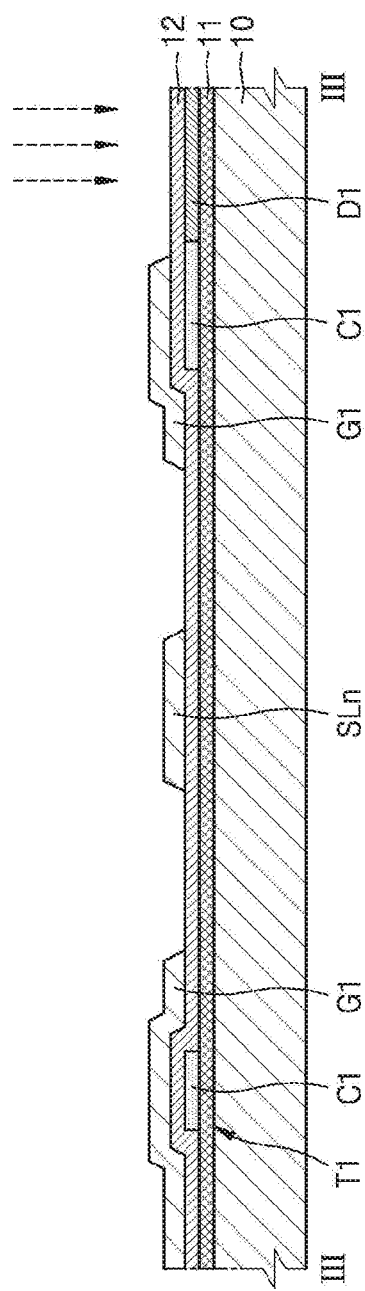

Referring to FIG. 5, the first insulating layer 12 may be formed on the buffer layer 11 to cover the semiconductor layer C1', and then the first conductive layer including the first electrode G1 and the first scan line SLn may be formed on the first insulating layer 12.

After the first conductive layer is formed, a portion of the semiconductor layer C1' may be doped with impurities by using the first electrode G1 as a mask. The portion doped with the impurities may be conductive and may correspond to a source region and a drain region included in an active layer of each of the transistors T1 through T7.

Due to the doping, the driving active layer A1 (see FIG. 2) included in the driving transistor T1 may be formed. The driving active layer A1 may include the source region S1 (see FIG. 2) and the drain region D1 that are spaced apart from each other and the channel region C1 that is disposed between the source region S1 and the drain region D1.

Figure 6:
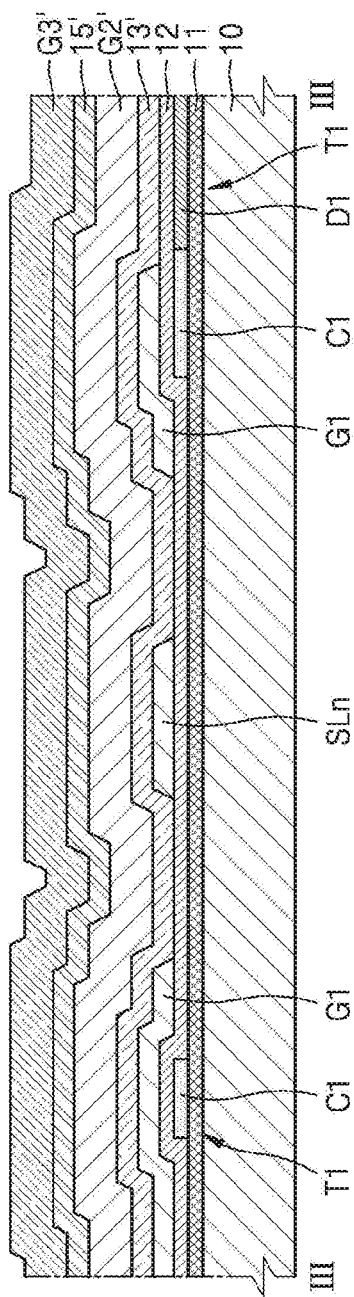

Referring to FIG. 6, a first insulating material 13' may be formed on the first insulating layer 12 to cover the first electrode G1 and the first scan line SLn, and a first conductive material G2', a second insulating material 15', and a second conductive material G3' may be sequentially formed on the first insulating material 13'.

Figure 7:
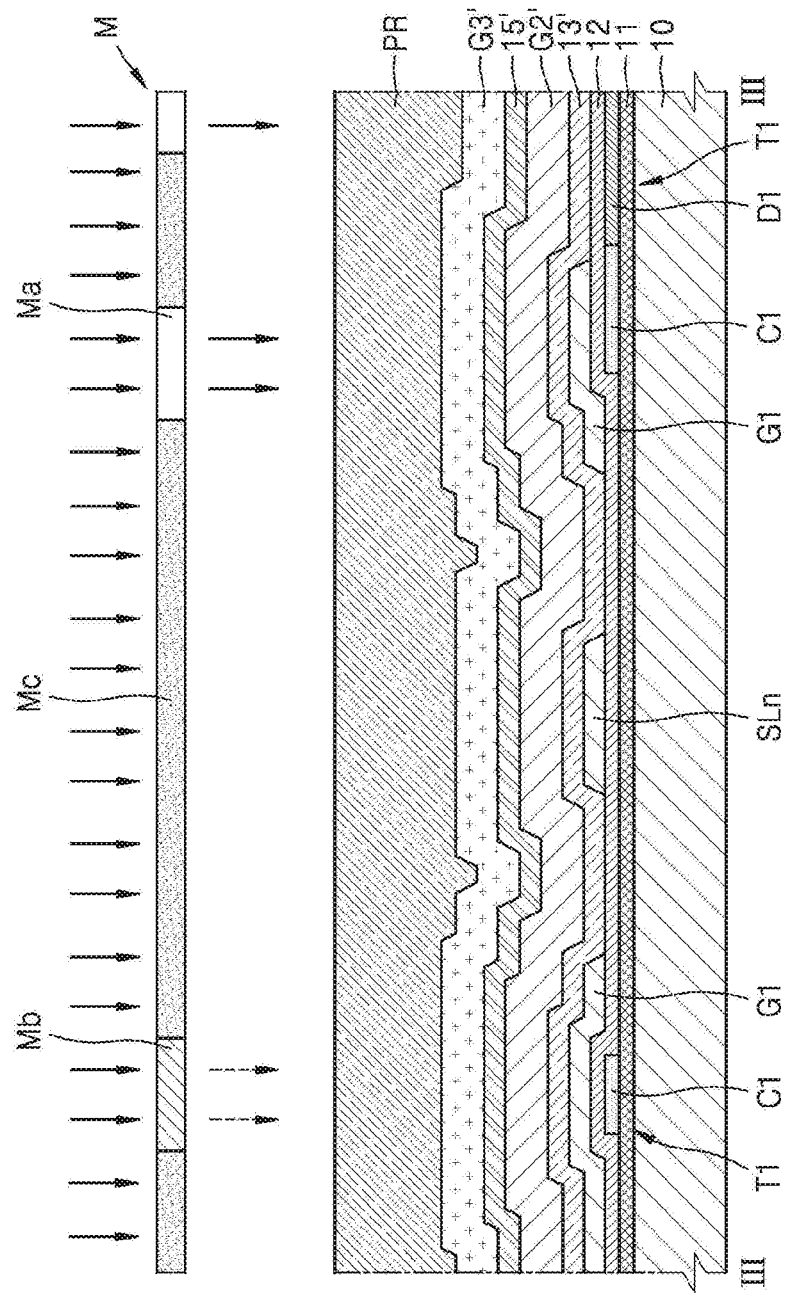

Referring to FIG. 7, a photosensitive material PR may be formed on the second conductive material G3', and then light may be irradiated to the photosensitive material PR by using a mask M. The mask M may be a half-tone mask including a transparent portion Ma that transmits light, a semi-transparent portion Mb that transmits part of light, and a light-shielding portion Mc that shields light. The photosensitive material PR may be a positive photosensitive material that allows a portion to which light is emitted to be dissolved in a developing solution. However, the described technology is not limited thereto, and the photosensitive material PR may be a negative photosensitive material. In this case, positions of the transparent portion Ma and the light-shielding portion Mc of the mask M may be exchanged.

Figure 8:
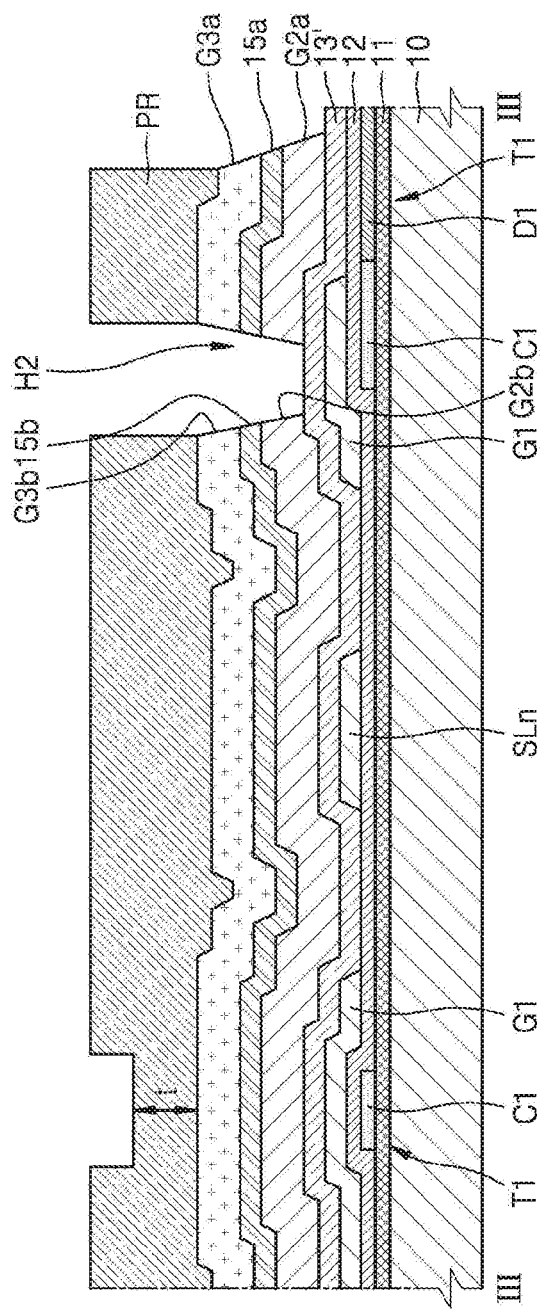

Referring to FIG. 8, a portion of the photosensitive material PR corresponding to the transparent portion Ma may be removed by a developing solution. The exposed second conductive material G3', the second insulating material 15' disposed under the second conductive material G3', and the second conductive material G2' disposed under the second insulating material 15' may be sequentially etched to form the end portions G2a, 15a, and G3a respectively on outer edges of the second electrode G2, the third insulating layer 15, and the third electrode G3 and the openings G2b, 15b, and G3b for forming the second opening H2.

That is, the transparent portion Ma may correspond to a portion where the first conductive material G2', the second insulating material 15', and the second conductive material G3' are removed.

The end portions G2a, 15a, and G3a that are formed by using the same mask may be patterned by using dry etching. Accordingly, the end portions G2a, 15a, and G3a and the openings G2b, 15b, and G3b may be continuously connected to one another without a step.

Since part of light is emitted to a portion corresponding to the semi-transparent portion Mb of the mask M, the photosensitive material PR is not completely removed and remains to a predetermined thickness t. Accordingly, the second conductive material G3' disposed on the portion corresponding to the semi-transparent portion Mb may not be etched in FIG. 8.

Figure 9:
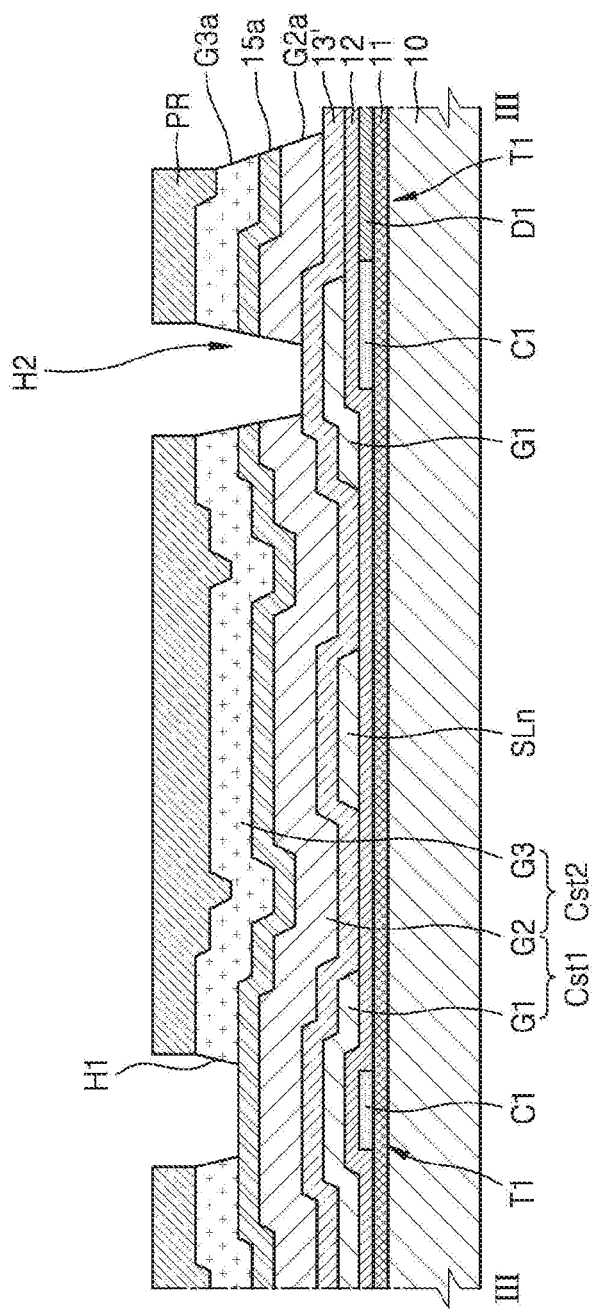

Referring to FIG. 9, a part of the photosensitive material PR may be removed by performing ashing after the process of FIG. 8. The photosensitive material PR may be removed by at least the predetermined thickness t, and thus the photosensitive material PR corresponding to the semi-transparent portion Mb may be completely removed. The second conductive material G3' exposed after the photosensitive material PR is removed may be etched to form the first opening H1. The second insulating material 15' may be exposed through the first opening H1.

The first conductive material G2' and the second conductive material G3' may be patterned by using one mask M through processes of FIGS. 7 through 9 to form the second electrode G2 and the third electrode G3. That is, the first capacitor Cst1 including the first electrode G1 and the second electrode G2 and the second capacitor Cst2 including the second electrode G2 and the third electrode G3 may be formed.

Figure 10:
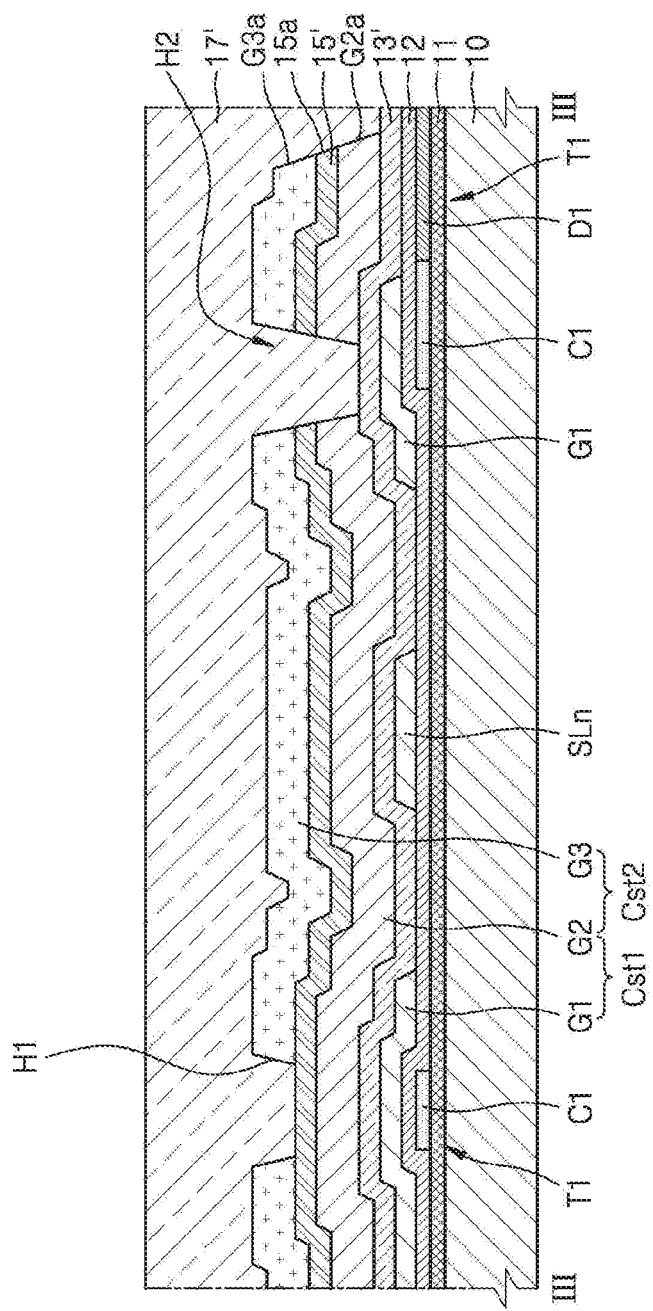
Figure 11:
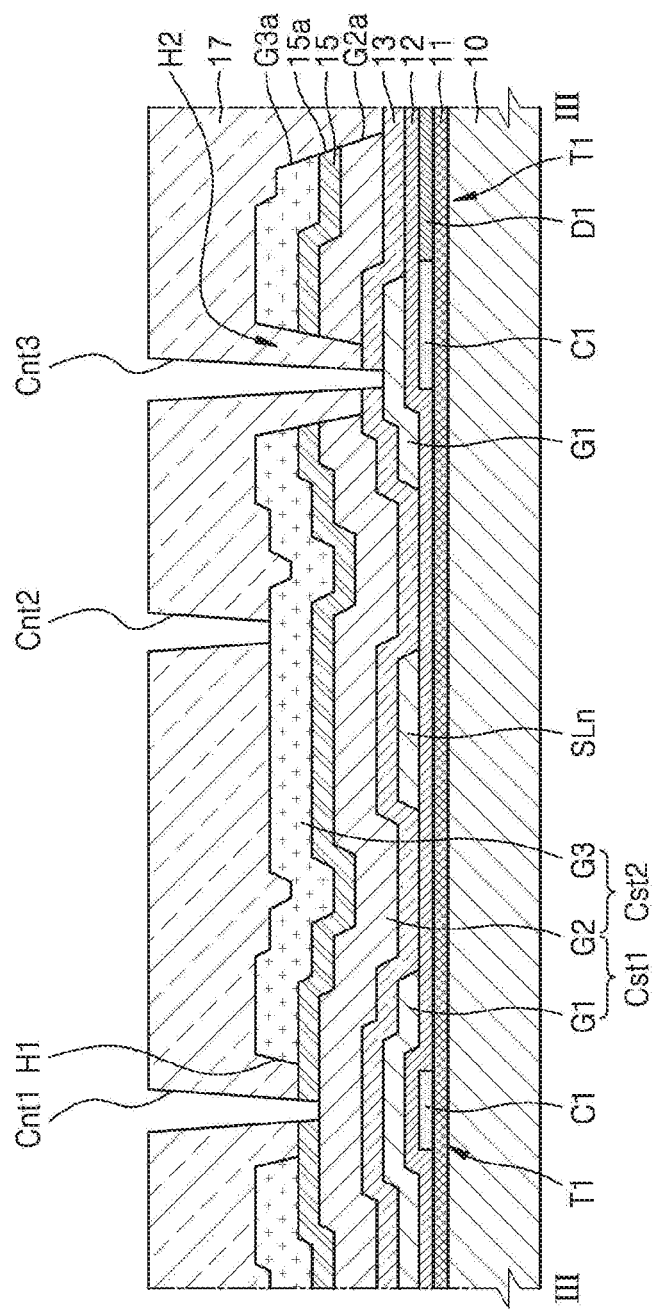

Referring to FIGS. 10 and 11, a third insulating material 17' may be formed on the second insulating material 15' to cover the third electrode G3, and then may be patterned to form the first contact hole Cnt1, the second contact hole Cnt2, and the third contact hole Cnt3.

The first contact hole Cnt1 may be formed by patterning the third insulating material 17' and the second insulating material 15', the second contact hole Cnt2 may be formed by patterning the third insulating material 17' to expose the third electrode G3. The third contact hole Cnt3 may be formed by patterning the third insulating material 17' and the first insulating material 13' to expose the first electrode G1. The first contact hole Cnt1 may be formed in the first opening H1 and the third contact hole Cnt3 may be formed in the second opening H2.

The first insulating material 13', the second insulating material 15', and the third insulating material 17' may be patterned to form the second insulating layer 13, the third insulating layer 15, and the fourth insulating layer 17 of FIG. 3.

Figure 12:
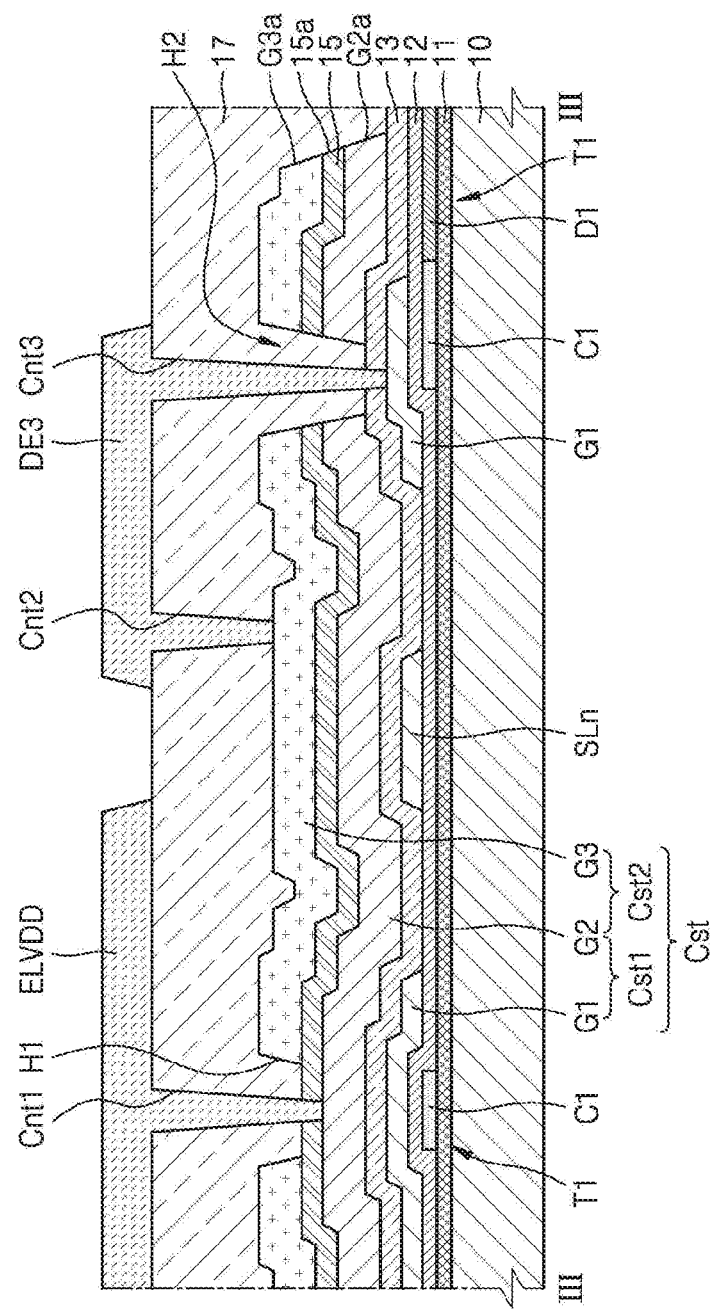

Referring to FIG. 12, the power line ELVDD and the compensation drain electrode DE3 of the compensation transistor T2 (see FIG. 2) may be formed on the fourth insulating layer 17. A part of the power line ELVDD may be buried in the first contact hole Cnt1 and may be connected to the second electrode G2 through the first contact hole Cnt1.

A part of the compensation drain electrode DE3 may be buried in the second contact hole Cnt2 and the third contact hole Cnt3, and may be connected to the third electrode G3 and the first electrode G1 respectively through the second contact hole Cnt2 and the third contact hole Cnt3. That is, the first electrode G1 and the third electrode G3 may be electrically connected to each other by the compensation drain electrode DE3, and thus the first capacitor Cst1 and the second capacitor Cst2 may be connected in parallel to each other to be included in the storage capacitor Cst.

Figure 13:
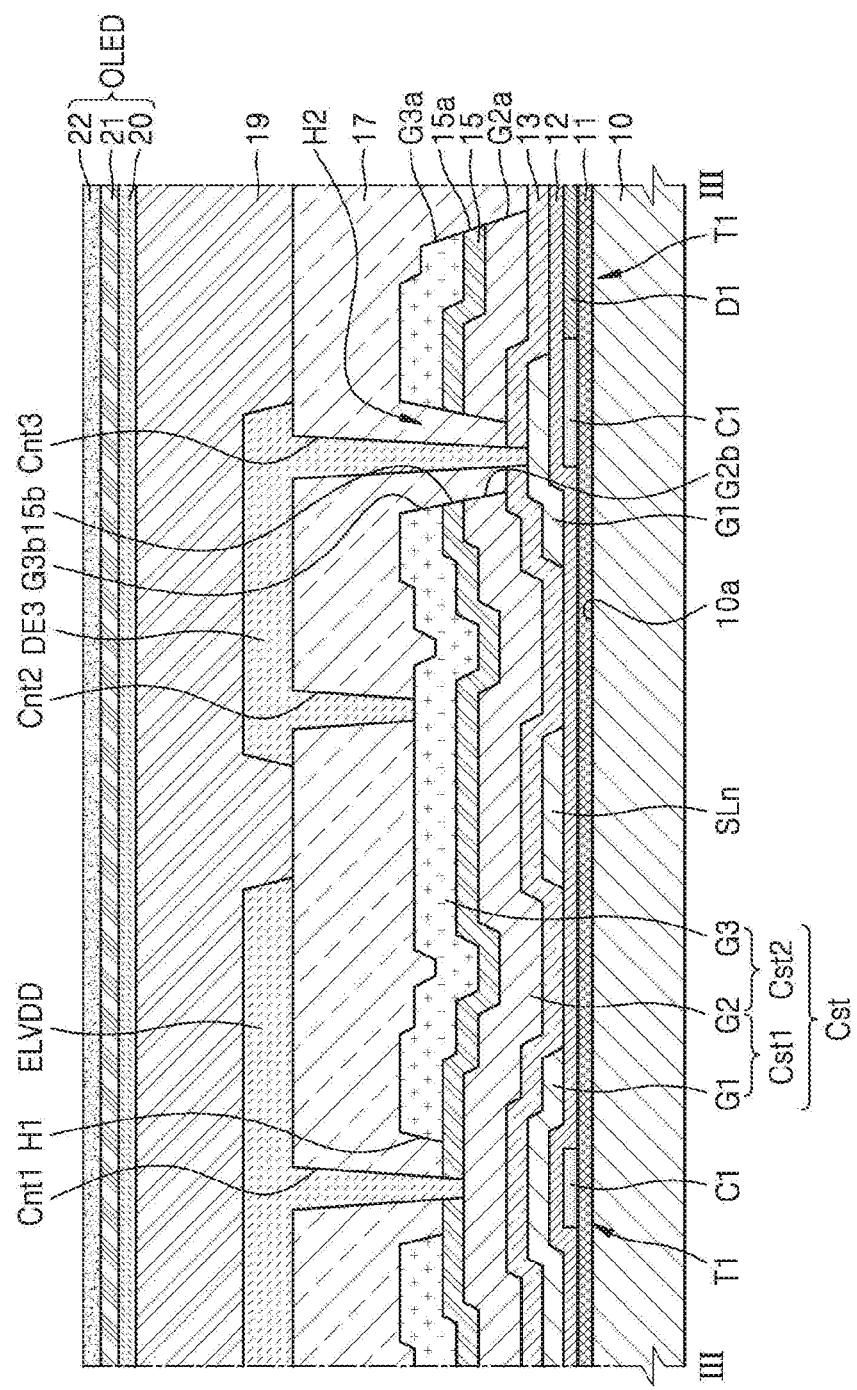

Referring to FIG. 13, the fifth insulating layer 19 may be formed on the fourth insulating layer 17 to cover the power line ELVDD and the compensation drain electrode DE3, and then the pixel electrode 20 electrically connected to the driving transistor T1, the intermediate layer 21 including the organic emission layer, and the counter electrode 22 may be sequentially formed on the fifth insulating layer 19 to form the OLED.

According to the method of manufacturing the OLED display, since the second electrode G2 and the third electrode G3 are formed by using one mask, an additional mask for forming the second capacitor Cst2 is not needed, thereby reducing manufacturing costs.

That is, the storage capacitor Cst having a high capacity and including the first capacitor Cst1 and the second capacitor Cst2 that are connected in parallel to each other may be provided without increasing manufacturing costs, and thus the OLED display having high image quality may be provided.

As described above, according to at least one of the disclosed embodiments, since a storage capacitor having a high capacity while occupying a minimum space is provided, an OLED display having improved image quality and a method of manufacturing the OLED display may be provided.

Also, since the number of masks is minimized, a method of manufacturing an OLED display with reduced manufacturing costs and a simplified process and an OLED display manufactured by using the method may be provided.

While the inventive concept has been particularly shown and described with reference to exemplary embodiments thereof, they are provided for the purposes of illustration and it will be understood by one of ordinary skill in the art that various modifications and equivalent other embodiments can be made from the inventive concept. Accordingly, the true technical scope of the inventive concept is defined by the technical spirit of the appended claims.

What is claimed is:

1. An organic light-emitting diode (OLED) display, comprising:
    a plurality of pixels, each pixel comprising a driving circuit, wherein the driving circuit includes a driving transistor and a storage capacitor electrically connected to the driving transistor,
    wherein the driving transistor comprises a driving active layer and a first electrode, wherein the first electrode is insulated from the driving active layer and overlaps at least a portion of the driving active layer in a depth dimension of the OLED display,
    wherein the storage capacitor comprises a first capacitor comprising the first electrode and a second electrode over the first electrode and a second capacitor comprising the second electrode and a third electrode over the second electrode,
    wherein the first electrode is a driving gate electrode,
    wherein the driving active layer comprises a drain region overlapping each of the second electrode and the third electrode in the depth dimension of the OLED display, and
    wherein each of the second and third electrodes has an area larger than that of the first electrode.

2. The OLED display of claim 1, wherein the first and third electrodes are electrically connected to each other.

3. The OLED display of claim 1, further comprising an OLED including:
    a pixel electrode electrically connected to the driving transistor;
    a counter electrode facing the pixel electrode; and
    an organic emission layer interposed between the pixel and counter electrodes.

4. The OLED display of claim 3, wherein each of the pixels comprises:
    a scan line extending in a first direction and disposed on the same layer as the first electrode;
    a data line extending in a second direction that crosses the first direction and disposed over a layer on which the third electrode is disposed; and
    a power line configured to apply a voltage to the driving transistor and disposed on the same layer as the data line.

5. The OLED display of claim 4, further comprising:
    a first insulating layer interposed between the driving active layer and the first electrode;
    a second insulating layer interposed between the first and second electrodes;
    a third insulating layer interposed between the second and third electrodes; and
    a fourth insulating layer interposed between the third electrode and the power line,
    wherein the third and fourth insulating layers have a first contact hole formed therethrough, and wherein the second electrode is electrically connected to the power line through the first contact hole.

6. The OLED display of claim 5, wherein the third electrode has a first opening corresponding to the first contact hole, and wherein the first opening has an area larger than that of the first contact hole.

7. The OLED display of claim 5, wherein the driving active layer comprises a driving source region configured to receive a voltage from the power line, wherein a driving drain region is spaced apart from the driving source region, and the driving active layer further comprises a driving channel region configured to electrically connect the driving source and drain regions to each other, and wherein the OLED display further comprises a compensation transistor configured to electrically connect the driving drain region and the storage capacitor to each other.

8. The organic light-emitting diode (OLED) display of claim 1, wherein the first, second and third electrodes overlap the driving active layer in a depth dimension of the OLED display.

9. The OLED display of claim 1, wherein the storage capacitor is directly connected between a gate of the driving transistor and a power line supplying a transmitting driving voltage to the pixel.

10. The OLED display of claim 1, wherein the driving active layer is arranged under the first electrode of the first capacitor and insulated from the first electrode of the first capacitor.

11. An organic light-emitting diode (OLED) display, comprising:
    a plurality of pixels, each pixel comprising a driving circuit, wherein the driving circuit includes a driving transistor and a storage capacitor electrically connected to the driving transistor,
    wherein the driving transistor comprises a driving active layer and a first electrode, wherein the first electrode is insulated from the driving active layer and overlaps at least a portion of the driving active layer in a depth dimension of the OLED display,
    wherein the storage capacitor comprises a first capacitor comprising the first electrode and a second electrode over the first electrode and a second capacitor comprising the second electrode and a third electrode over the second electrode,
    wherein the first electrode is a driving gate electrode,
    wherein the driving active layer comprises a drain region overlapping each of the second electrode and the third electrode in the depth dimension of the OLED display, and
    wherein the OLED display further comprises an insulating layer interposed between the second and third electrodes, wherein the second electrode; the insulating layer, and the third electrode comprise end portions that are continuously connected to one another without a step.

12. An organic light-emitting diode (OLED) display, comprising:
    a plurality of pixels, each pixel comprising a driving circuit, wherein the driving circuit includes a driving transistor and a storage capacitor electrically connected to the driving transistor;
    wherein the driving transistor comprises a driving active layer and a first electrode, wherein the first electrode is insulated from the driving active layer and overlaps at least a portion of the driving active layer in a depth dimension of the OLED display;
    wherein the storage capacitor comprises a first capacitor comprising the first electrode and a second electrode over the first electrode and a second capacitor comprising the second electrode and a third electrode over the second electrode;
    wherein the first electrode is a driving gate electrode, and the driving active layer comprises a drain region overlapping the second electrode in the depth dimension of the OLED display;
    wherein the OLED display further comprises: a pixel electrode electrically connected to the driving transistor; a counter electrode facing the pixel electrode; and an organic emission layer interposed between the pixel and counter electrodes;

wherein each of the pixels comprises: a scan line extending in a first direction and disposed on the same layer as the first electrode; a data line extending in a second direction that crosses the first direction and disposed over a layer on which the third electrode is disposed; and a power line configured to apply a voltage to the driving transistor and disposed on the same layer as the data line;

wherein the OLED display further comprising: a first insulating layer interposed between the driving active layer and the first electrode; a second insulating layer interposed between the first and second electrodes; a third insulating layer interposed between the second and third electrodes; and a fourth insulating layer interposed between the third electrode and the power line, wherein the third and fourth insulating layers have a first contact hole formed therethrough, and wherein the second electrode is electrically connected to the power line through the first contact hole;

wherein the driving active layer comprises a driving source region configured to receive a voltage from the power line, wherein a driving drain region is spaced apart from the driving source region, and the driving active layer further comprises a driving channel region configured to electrically connect the driving source and drain regions to each other, and wherein the OLED display further comprises a compensation transistor configured to electrically connect the driving drain region and the storage capacitor to each other; and wherein the compensation transistor comprises a compensation drain electrode electrically connected to the first electrode and disposed on the same layer as the data line, wherein the fourth insulating layer has a second contact hole formed therethrough, and wherein the compensation drain electrode is connected to the third electrode through the second contact hole.

13. The OLED display of claim 12, wherein the second and fourth insulating layers have a third contact hole formed therethrough, and wherein the compensation drain electrode is electrically connected to the first electrode through the third contact hole.

14. An organic light-emitting diode (OLED) display, comprising:

a plurality of pixels, each pixel comprising a driving circuit, wherein the driving circuit includes a driving transistor and a storage capacitor electrically connected directly between a gate of the driving transistor and a power line supplying a transmitting driving voltage, wherein the driving transistor comprises a driving active layer and a first electrode, the driving gate electrode is insulated from the driving active layer and overlaps at least a portion of the driving active layer in a depth dimension of the OLED display, wherein the storage capacitor comprises a first capacitor comprising the first electrode and a second electrode over the first electrode and a second capacitor comprising the second electrode and a third electrode over the second electrode, wherein the first electrode is a driving gate electrode, and the driving active layer comprises a drain region overlapping a capacitive portion of the second capacitor in the depth dimension of the OLED display, and wherein the storage capacitor is directly connected between a gate of the driving transistor and a power line supplying a transmitting driving voltage to the pixel.

15. An organic light-emitting diode (OLED) display, comprising:

a plurality of pixels, each pixel comprising a driving circuit, wherein the driving circuit includes a driving transistor and a storage capacitor electrically connected to the driving transistor, wherein the driving transistor comprises a driving active layer and a first electrode, wherein the first electrode is insulated from the driving active layer and overlaps at least a portion of the driving active layer in a depth dimension of the OLED display, wherein the storage capacitor comprises a first capacitor comprising the first electrode and a second electrode over the first electrode and a second capacitor comprising the second electrode and a third electrode over the second electrode and wherein the first electrode is a driving gate electrode, and wherein the driving active layer comprises a drain region overlapping each of the second electrode and the third electrode in the depth dimension of the OLED display, wherein the OLED display further comprises a compensation transistor that compensates for a threshold voltage of the driving transistor, the compensation transistor having a compensation drain electrode positioned over the third electrode, and wherein the compensation drain electrode is directly connected to the first electrode.

* * * * *